United States Patent
Abiko (10) Patent No.: US 8,027,182 B2
(45) Date of Patent: Sep. 27, 2011

(54) ELECTRIC CURRENT MEASUREMENT APPARATUS, VOLTAGE MEASUREMENT APPARATUS AND POWER SUPPLY APPARATUS

(75) Inventor: Shuji Abiko, Kanagawa (JP)

(73) Assignee: NEC Microwave Tube, Ltd., Kanagawa (JP)

( * ) Notice: Subject to any disclaimer, the term of this patent is extended or adjusted under 35 U.S.C. 154(b) by 385 days.

(21) Appl. No.: 12/403,105

(22) Filed: Mar. 12, 2009

(65) Prior Publication Data
US 2009/0237041 A1    Sep. 24, 2009

(30) Foreign Application Priority Data
Mar. 19, 2008 (JP) ................. 2008-071560

(51) Int. Cl.
*H02M 7/46* (2006.01)
(52) U.S. Cl. .................................. 363/120
(58) Field of Classification Search .......... 363/29, 363/30, 99, 111–113, 120–122; 315/1, 3, 315/411; 324/72, 76.76, 87–89, 96, 97, 121 R; 702/64
See application file for complete search history.

(56) References Cited

U.S. PATENT DOCUMENTS

| 5,781,429 A * | 7/1998 | Tomimatsu et al. .......... 363/112 |
| 7,916,507 B2 * | 3/2011 | Birnbach ......................... 363/31 |
| 2009/0218948 A1 * | 9/2009 | Nakazato .......................... 315/3 |

FOREIGN PATENT DOCUMENTS
JP       2711897 B    10/1997

* cited by examiner

*Primary Examiner* — Matthew Nguyen (57) ABSTRACT

An electric current measurement apparatus for measuring an electric current of each electrode of an electron tube includes a transformer, a detection resistor connected in an ampere meter route for measurement, a voltage detection unit for detecting electric potential difference of the detection resistor and outputting pulse signals corresponding to the detected electric potential difference, a switching part for providing a short circuit of the secondary winding according to the pulse signals, and a measurement current value output unit. The measurement current value output unit measures pulse attribute of pulse-shape signals which are induced on the primary winding of the transformer caused by the short circuit of the secondary winding, and outputs a value of electric current flowing through the detection resistor with referring to a predetermined relationship between a value of the electric current flowing through the detection resistor and the pulse signals generated in the voltage detection unit.

14 Claims, 10 Drawing Sheets

Fig.10 ed to the rectifier circuit. In this special transformer, the currents which flow to two primary windings are offset with each other. Therefore, such configuration prevents the magnetic flux of the magnetic core from saturating even in case of flowing a big DC current, and an electric current which flows to the secondary winding of the voltage conversion transformer is measured as a voltage between both ends of a resistance inserted in series to the secondary winding of the special transformer.

ELECTRIC CURRENT MEASUREMENT APPARATUS, VOLTAGE MEASUREMENT APPARATUS AND POWER SUPPLY APPARATUS

This application is based upon and claims the benefit of priority from Japanese patent application No. 2008-071560, filed on Mar. 19, 2008 the disclosure of which is incorporated herein in its entirety by reference.

TECHNICAL FIELD

The present invention relates to an electric current measurement apparatus suitable for measuring an electric current which flows to an electrode of an electron tube, a voltage measurement apparatus suitable for measuring the voltage applied on an electrode of an electron tube and a power supply apparatus equipped with those apparatus.

BACKGROUND ART

Figure 9:
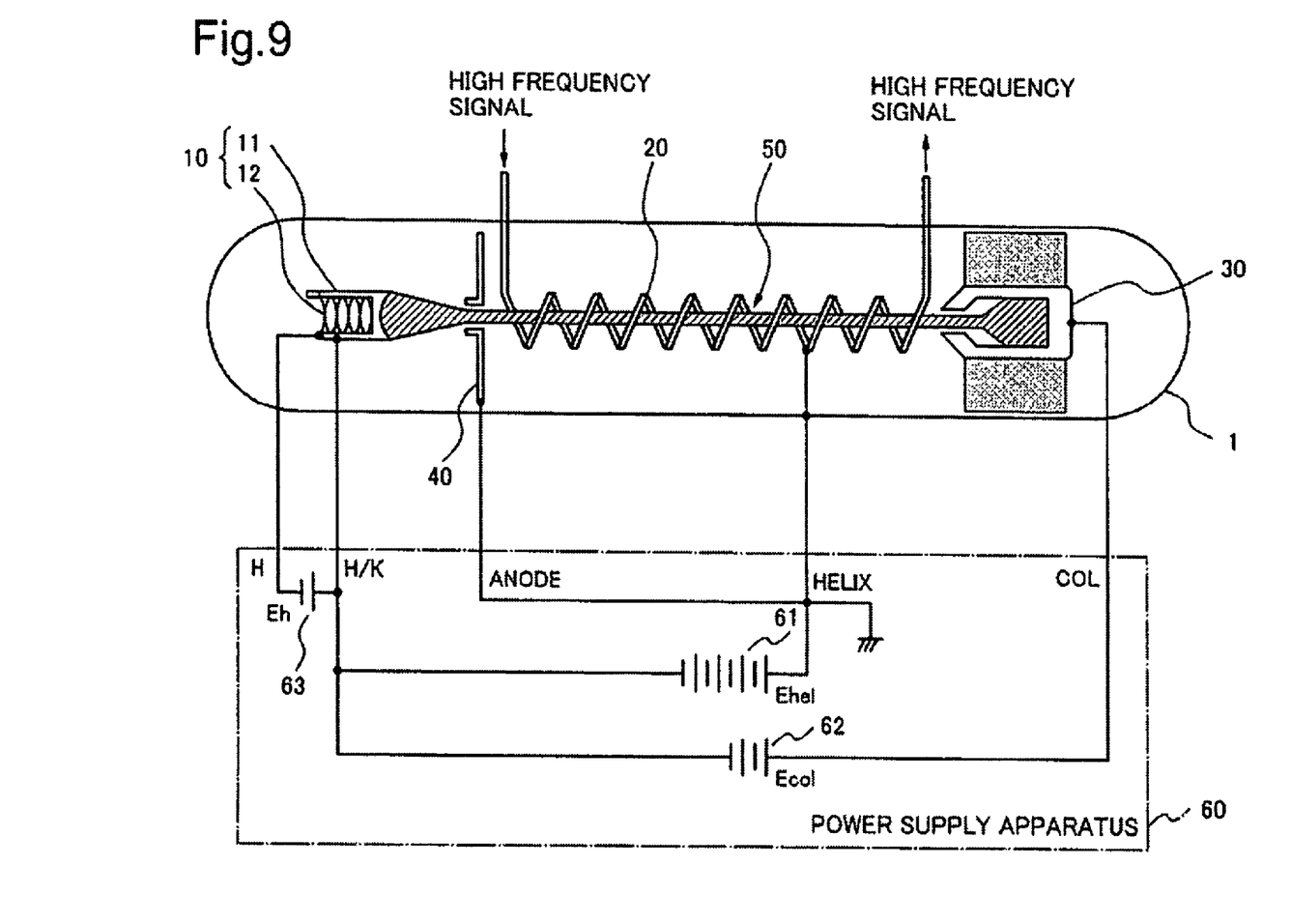
FIG. 9 is a block diagram showing a composition of the background art of a high-frequency circuit system.

A traveling wave tube and klystron or the like are electron tubes which oscillate or amplify a high-frequency signal (microwaves) by interacting an electron beam ejected from an electron gun with the high-frequency signal. A composition example of the traveling wave tube 1 is illustrated in FIG. 9. The traveling wave tube includes an electron gun 10, a spiral-shape helix electrode 20, a collector electrode 30 and an anode electrode 40. The electron gun 10 ejects an electron beam 50. The helix electrode 20 is a high-frequency circuit which interacts the electron beam 50 ejected from the electron gun 10 with the high-frequency signal (microwaves). The collector electrode 30 captures the electron beam 50 outputted through the helix electrode 20. The anode electrode 40 draws out electrons from the electron gun 10 and leads the electron beam 50 ejected from the electron gun 10 into space surrounded by the helix electrode 20. The electron gun 10 includes a cathode electrode 11 which ejects thermal electrons and a heater 12 which gives thermal energy for ejecting thermal electrons to the cathode electrode 11.

The electron beam 50 ejected from the electron gun 10 is accelerated by electric potential difference between the cathode electrode 11 and the helix electrode 20, and is introduced into space surrounded by the helix electrode 20. The electron beam 50 travels through the space surrounded by the helix electrode 20 interacting with the high-frequency signal inputted from one end of the helix electrode 20. The electron beam 50 which has passed through the space surrounded by the helix electrode 20 is captured in the collector electrode 30. At that time, the high-frequency signal amplified by the interaction with the electron beam 50 is outputted from other end of the helix electrode 20.

A power supply apparatus 60 includes a helix power supply 61, a collector power supply 62 and a heater power supply 63. The helix power supply 61 supplies helix voltage (Ehel) between the helix electrode and the cathode electrode 11. The helix voltage (Ehel) supplied on the cathode electrode 11 is a negative DC (direct-current) voltage based on the electric potential of the helix electrode 20 (HELIX). The collector power supply 62 supplies the collector voltage (Ecol) between the collector electrode and the cathode electrode 11. The collector voltage (Ecol) supplied on the collector electrode 30 is a positive DC voltage based on the electric potential of the cathode electrode 11 (H/K). The heater power supply 63 supplies the heater voltage (Eh) between the cathode electrode 11 (H/K) and the heater 12. The heater voltage (Eh) supplied on the heater 12 is a negative DC voltage based on the electric potential of the cathode electrode 11 (H/K). The helix electrode 20 is usually connected to a case of the traveling wave tube 1 and grounded in the power supply apparatus 60.

Further, although FIG. 9 shows an exemplary configuration of the traveling wave tube 1 equipped with only one collector electrode 30, the traveling wave tube may also have a configuration in which a plurality of collector electrodes are provided. In FIG. 9, although a configuration in which the anode electrode 40 is connected with the helix electrode 20 in the power supply apparatus 60 is shown, the traveling wave tube may also have a configuration in which an anode voltage (Ea) is supplied between the cathode electrode 11 (H/K) and the anode electrode 40, and the anode voltage (Ea) is a positive DC voltage based on the electric potential of the cathode electrode 11 (H/K).

The helix voltage (Ehel), the collector voltage (Ecol) and the heater voltage (Eh) are generated by using the power supply apparatus which includes an inverter, a transformer and a rectifier circuit. The inverter converts a DC voltage supplied from outside into an AC (alternating current) voltage and supplies the converted AC voltage on a primary winding of the transformer as an output. The transformer performs voltage conversion of the AC voltage inputted to the primary winding, and outputs the AC voltage converted into a desired voltage from a secondary winding. The rectifier circuit converts the AC voltage outputted from the secondary winding of the transformer into the DC voltage which has a desired voltage value. Therefore, the power supply apparatus is provided for outputting the DC voltage having a desired voltage value necessary for each of the helix voltage (Ehel), the collector voltage (Ecol) and the heater voltage (Eh).

Figure 10:
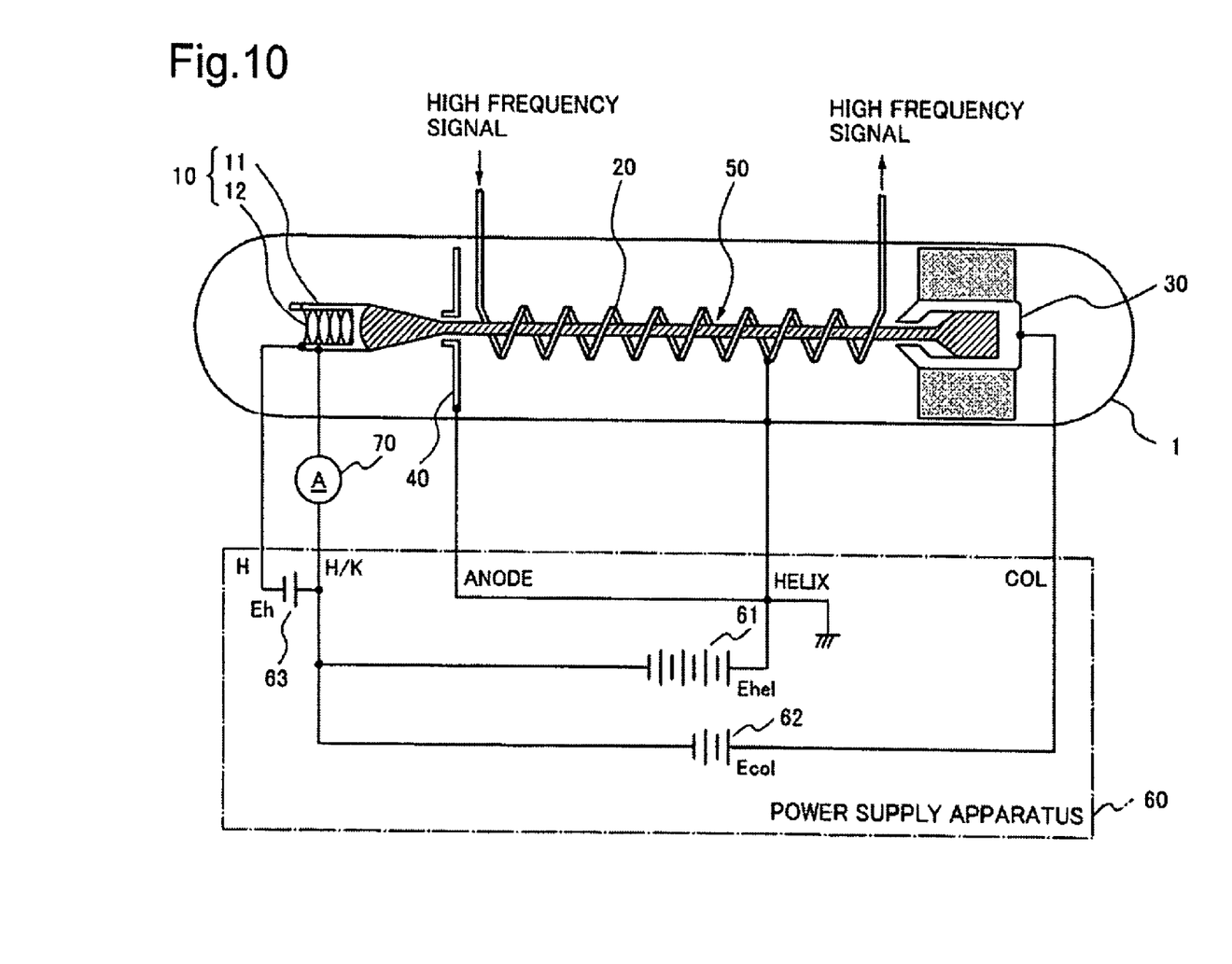
FIG. 10 is a block diagram showing a composition of one example of method for measuring an operating current of the traveling wave tube by using an ammeter.

As a method for measuring an electric current which flows to the cathode electrode 11, the collector electrode 30, the helix electrode 20 or heater 12 of such a traveling wave tube, usually a method as shown in FIG. 10 in which an ammeter 70 is inserted in series between the electrode (in FIG. 10, cathode electrode 11) and the power supply apparatus 60 is considered.

However, high voltage (several kV to several 10 kV) is applied on the cathode electrode, the collector electrode and the heater. Therefore, when measuring the electric current which flows to the cathode electrode, the collector electrode and the heater by using such an ammeter 70, it is necessary to conduct secure insulation to the ammeter 70 in order to perform measurement work safely. It is because high voltage is also applied on the ammeter 70.

Further, it is necessary to prepare and use a special measurement apparatus and a special equipment in order to perform measurement of the electric current flowing to each electrode or voltage applied on each electrode of the traveling wave tube. Therefore, it is difficult to measure such electric current and the voltage simply under operating condition of the traveling wave tube.

Japanese Patent No. 2711897 discloses technology about a power supply apparatus which measures an electric current which flows to the collector electrode of the traveling wave tube with providing a special transformer for electric current detection and measurement.

The power supply apparatus according to this technology has a configuration in which the special transformer is inserted in series between a secondary winding (output side) of the voltage conversion transformer and the rectifier circuit. A couple of primary windings of this special transformer are inserted in series at the output side (secondary winding) of the voltage conversion transformer, and the output side (secondary winding) of the voltage conversion transformer is connected with the rectifier circuit. The rectifier circuit outputs a DC voltage having a high voltage value to the cathode electrode and the collector electrode of the traveling wave tube. By such configuration, an electric current, which corresponds to the electric current flowing to the collector electrode of the traveling wave tube, flows to the primary windings of the special transformer, then, at the secondary winding of the special transformer, an electric current which is proportional to the electric current flowing to the primary windings of the special transformer can be measured.

Here, in this power supply apparatus, the cathode current is measured and outputted as the measured current value by applying the following approximation: it is supposed that the helix current and the anode current are negligible small compared with the collector current and the cathode current, and these values are ignored; and it assumes that the cathode current is equal to the collector current.

SUMMARY

An exemplary object of the present invention is to provide an electric current measurement apparatus, a voltage measurement apparatus and a power supply apparatus equipped with these apparatus which can safely and simply measure an electric current flowing to each electrode and voltage applied on each electrode.

An electric current measurement apparatus for measuring an electric current flowing to a desired electrode of an electron tube according to an exemplary aspect of the invention includes a transformer having a primary winding of input side and a secondary winding of output side; a detection resistor connected in series in an ampere meter route of the desired electrode through which a measurement target electric current flows; a voltage detection unit which detects electric potential difference at the detection resistor and outputs pulse signals having pulse attribute corresponding to a detected value of the electric potential difference; a switching part connected between two wirings of the secondary winding of the transformer for providing a short circuit of the secondary winding according to the pulse signals outputted from the voltage detection unit; and a measurement current value output unit which measures pulse attribute of pulse-shape electric currents being induced on the primary winding of the transformer caused by intermittent short circuit of the secondary winding provided by the switching part, and outputs a value of the measurement target electric current flowing through the detection resistor based on a measurement result of the pulse attribute of the pulse-shape electric currents with referring to a predetermined relationship between a value of the electric current flowing through the detection resistor and the pulse attribute of the pulse signals generated in the voltage detection unit.

BRIEF DESCRIPTION OF THE DRAWINGS

Exemplary features and advantages of the present invention will become apparent from the following detailed description when taken with the accompanying drawings in which.

EXEMPLARY EMBODIMENT

Exemplary embodiments of the present invention will now be described in detail in accordance with the accompanying drawings.

In the following explanation, it is described about an electric current measurement apparatus and a voltage measurement apparatus for each electrode of the traveling wave tube as an example, however, the present invention can also be applied to an electric current measurement apparatus which measures the electric current flowing to each electrode of other types of electron tube and a voltage measurement apparatus which measures the voltage applied on each electrode of other types of electron tube.

A First Exemplary Embodiment

Figure 1:
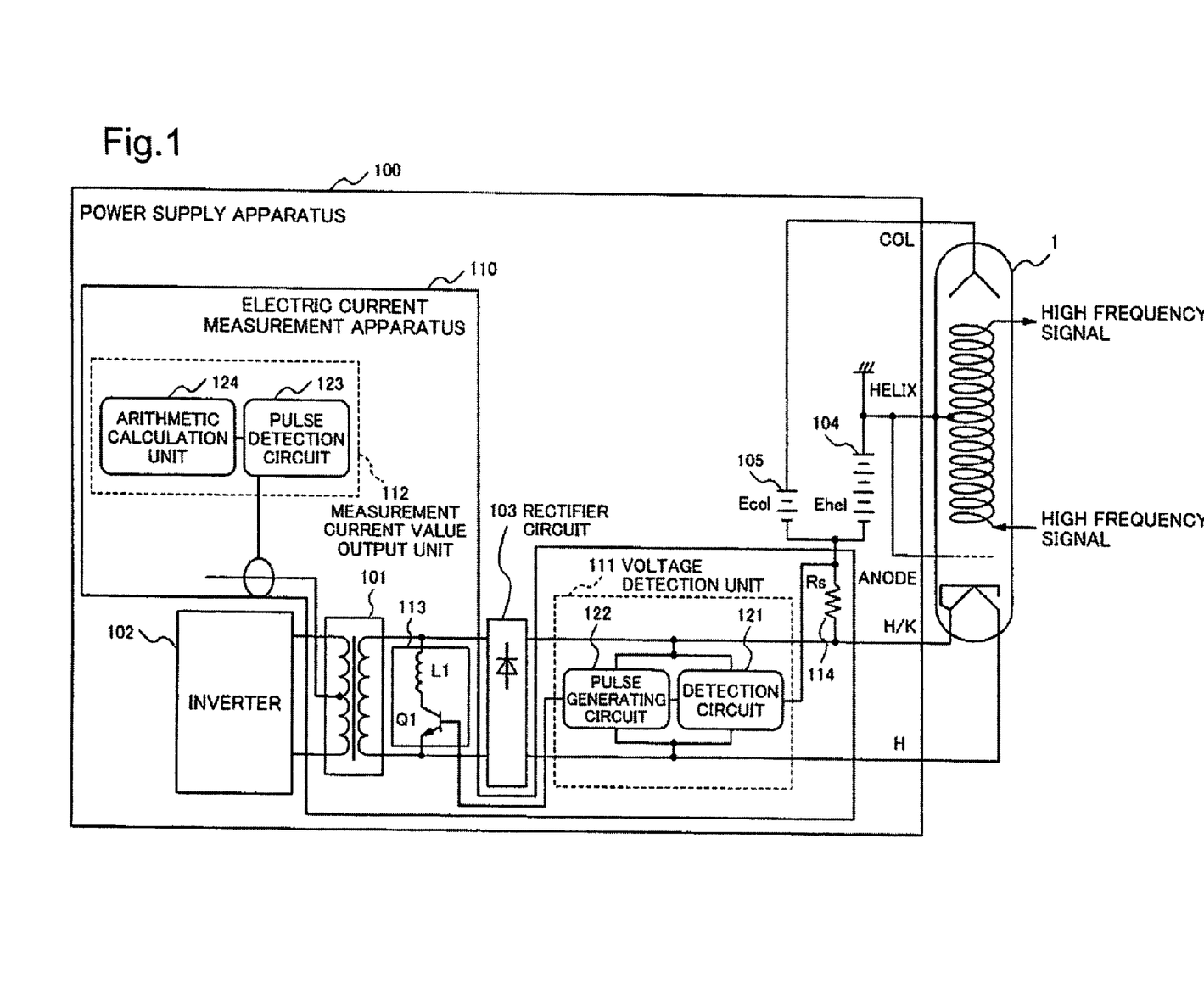
FIG. 1 is a block diagram showing one exemplary configuration of an embodiment of an electric current measurement apparatus for measuring the cathode current.

FIG. 1 is a block diagram showing one exemplary configuration of the embodiment of an electric current measurement apparatus.

The electric current measurement apparatus of this embodiment is included in a heater power supply, which generates the heater voltage (Eh) to be supplied to a heater, among a plurality of DC voltage sources provided in the power supply apparatus 100 which supplies predetermined DC voltage to each electrode of the traveling wave tube 1.

As shown in FIG. 1, the heater power supply includes an inverter 102, a transformer 101 and a rectifier circuit 103. The inverter 102 converts a DC voltage supplied from outside into an AC (alternating current) voltage, and inputs the AC voltage to a primary winding of the transformer 101. The transformer 101 performs voltage conversion of the AC voltage inputted to the primary winding, and outputs an AC voltage having a desired voltage value from the secondary winding. The rectifier circuit 103 converts the converted AC voltage outputted from the secondary winding of the transformer 101 into a DC voltage having a desired voltage value of each electrode. Because the transformer 101, the inverter 102 and the rectifier circuit 103 as the composition of a DC voltage source are well-known configurations, the detailed description will be omitted here.

The electric current measurement apparatus 110 includes the transformer 101, a detection resistor Rs 114, a voltage detection unit 111, a switching part 113 and a measured current value output unit 112.

The detection resistor Rs 114 is provided and connected in series in an ampere meter route of a desired electrode through which a measurement target electric current flows to the desired electrode of the traveling wave tube. Electric potential difference occurs between both ends of the detection resistor Rs 114 by the measurement target electric current flowing through the detection resistor Rs 114.

The voltage detection unit 111 detects the electric potential difference between both ends of the detection resistor Rs 114, and outputs pulse signals. These pulse signals outputted from the voltage detection unit 111 have pulse attribute corresponding to a detected value of the electric potential difference. As will be described later, the pulse attribute changes proportionally to the detected electric potential difference.

The switching part 113 is connected between two wirings of a secondary winding of the transformer. The switching part 113 provides a short circuit of the secondary winding when the switching part 113 turns on, and the switching part 113 repeats turning on and off according to the pulse signals outputted from the voltage detection unit 111. Therefore, the secondary winding of the transformer 101 is intermittently short-circuited.

The measured current value output unit 112 measures pulse attribute of pulse-shape electric currents which are induced on the primary winding of the transformer 101. The pulse-shape electric currents are induced by the intermittent short circuits of the secondary winding provided by the switching part 113. That is, two wirings of the second winding side are connected and disconnected repeatedly, and it causes the pulse-shape electric currents to be induced at the primary winding side. The pulse attribute of pulse-shape electric currents corresponds to how intermittently short-circuit at the secondary winding side. Then, the measured current value output unit 112 outputs a value of the measurement target electric current flowing through the detection resistor Rs 114 based on the measurement result of the pulse attribute. At this time, the measured current value output unit 112 calculates the value of the measurement target electric current with referring to a predetermined relationship between a value of the electric current flowing through the detection resistor Rs 114 and the pulse attribute of the pulse signals generated in the voltage detection unit 111.

In more detail, the voltage detection unit 111 includes a detection circuit 121 and a pulse generating circuit 122. The detection circuit 121 detects the electric potential difference having occurred between both ends of the detection resistor Rs 114. The pulse generating circuit 122 generates pulse signals. The pulse attribute of the pulse signals changes according to an output voltage value that indicates electric potential difference detected by the detection circuit 121. The measured current value output unit 112 includes a pulse detection circuit 123 and an arithmetic calculation unit 124. The pulse detection circuit 123 detects the pulse-shape electric currents flowing on the primary winding of the transformer 101. The pulse-shape electric currents are induced by the intermittent short circuits of the secondary winding provided by the switching part 113. The arithmetic calculation unit 124 measures the pulse attribute of the pulse-shape electric currents detected by the pulse detection circuit 123 and calculates a value of electric current flowing through the detection resistor Rs 114 with referring to a predetermined relationship between a value of the electric current flowing through the detection resistor Rs 114 and the pulse attribute of the pulse signals generated in the pulse generating circuit 122.

The transformer 101 to be used for this exemplary embodiment shares the voltage conversion transformer provided in the heater power supply.

As shown in FIG. 1, the detection resistor Rs 114 is inserted, for example, between the cathode electrode and a common negative electrode of the helix power supply 104 and the collector power supply 105. The helix power supply 104 generates the helix voltage (Ehel) and the collector power supply 105 generates the collector voltage (Ecol). In this case, the cathode current of the traveling wave tube 1 can be measured.

Figure 2:
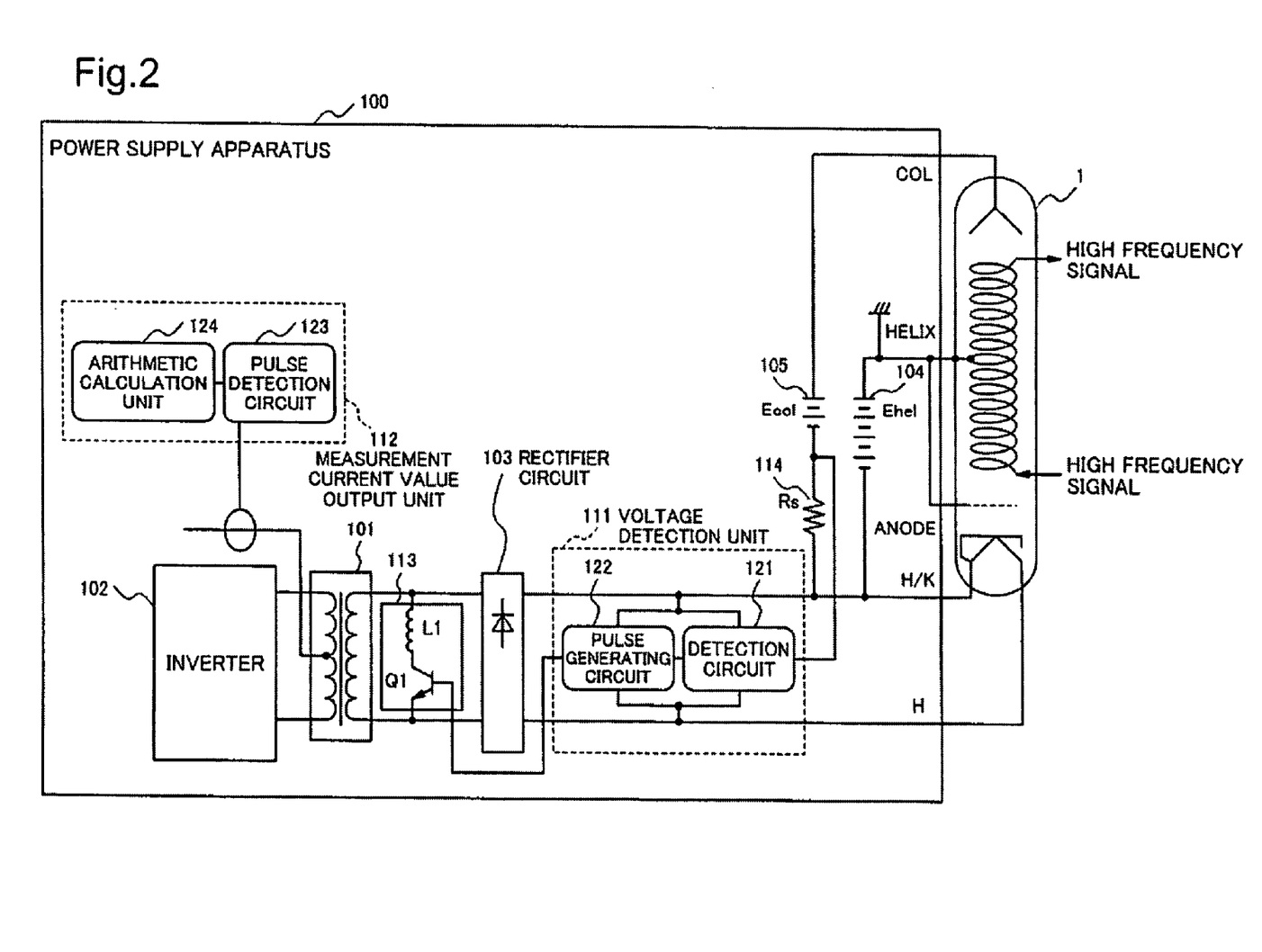
FIG. 2 is a block diagram showing other exemplary configurations of the embodiment of the electric current measurement apparatus for measuring the collector current.
Figure 3:
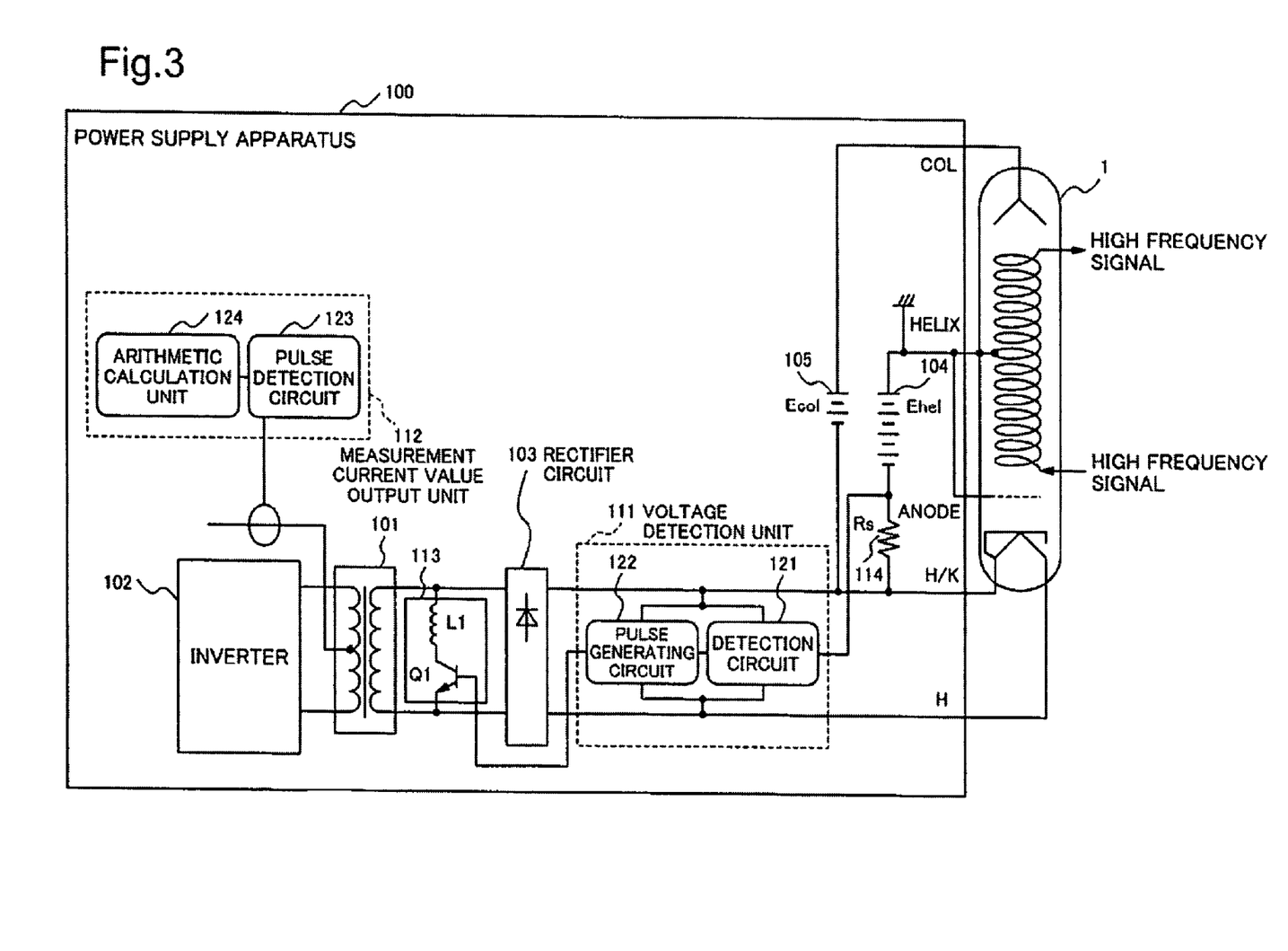
FIG. 3 is a block diagram showing other exemplary configurations of the embodiment of the electric current measurement apparatus for measuring the helix current.
Figure 4:
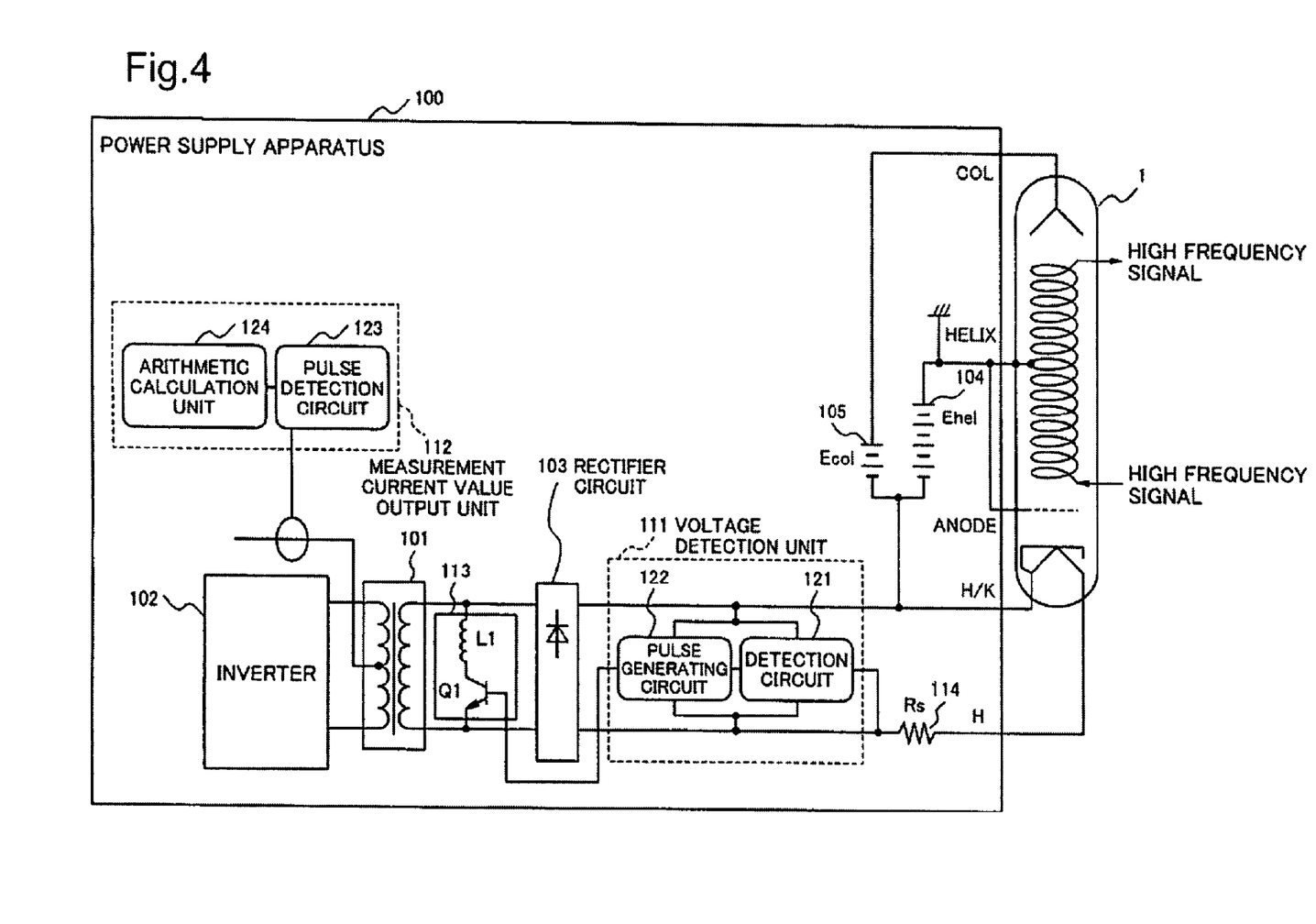
FIG. 4 is a block diagram showing other exemplary configurations of the embodiment of the electric current measurement apparatus for measuring the heater current.

When measuring the collector current of the traveling wave tube 1, the detection resistor Rs 114 is inserted between a negative electrode of the collector power supply 105 and the cathode electrode of the traveling wave tube 1 as shown in FIG. 2. When measuring the helix current of the traveling wave tube 1, the detection resistor Rs 114 is inserted between a negative electrode of the helix power supply 104 and the cathode electrode of the traveling wave tube 1 as shown in FIG. 3. When measuring the heater current, the detection resistor Rs 114 is inserted between a negative electrode of the heater power supply and the heater of the traveling wave tube as shown in FIG. 4.

When measuring the anodic current for the traveling wave tube 1 which has a configuration of no connection between the anode electrode and the helix electrode, the detection resistor Rs 114 is inserted between a positive electrode of an anode power supply (not shown) and the anode electrode of the traveling wave tube 1. It may be equipped with all these detection resistors Rs in the power supply apparatus 100 at the same time for measuring all types of electric current, and also it may be equipped with only one or some of these detection resistors Rs for measuring one or some types of electric current. When a plurality of detection resistors Rs are provided for measuring a plurality of types of electric current, for example, the detection circuit 121 and the pulse generating circuit 122 corresponding to respective detection resistors Rs are also provided and pulse signals outputted from a plurality of pulse generating circuits 112 may be supplied to the switching part 113 successively by using a multiplexer or the like.

The detection circuit 121 detects the electric potential difference having occurred between both ends of the detection resistor Rs 114, and outputs a detection voltage value according to magnitude of the electric potential difference. The detection circuit 121 includes a buffer circuit which amplifies the input electric potential difference as required and outputs the amplified electric potential difference.

The pulse generating circuit 122 can be composed by, for example, a V/F converter (voltage/frequency transducer), VCO (Voltage Controlled Oscillator), a PWM (Pulse Width Modulation) circuit or a PDM (Pulse Density Modulation) circuit, which are all well-known apparatus. The pulse generating circuit 122 generates pulse signals in which the pulse attribute (such as frequency, the cycle, the pulse width and the pulse density) changes according to the detection voltage value outputted from the detection circuit 121. Further, as will be described later, a pulse-shape electric current, which has the same pulse attribute as the pulse signal generated by the pulse generating circuit 122, flows on the primary winding of the transformer 101. Therefore, it is desirable to set a frequency and pulse width of the pulse signal generated in the pulse generating circuit 122 in order to distinguish a pulse-shape electric current of the measuring target from the pulse signal of operating current of the inverter 102. Specifically, it is desirable for the pulse signal generated in the pulse generating circuit 122 that the frequency is sufficiently lower than the switching frequency of the inverter 102 and the pulse width is sufficiently narrower than the switching cycle of the inverter 102.

As shown in FIG. 1, for example, the switching part 113 includes a transistor Q1 which is inserted between two wirings of the secondary winding of the transformer 101, i.e., an emitter and a collector are connected to the respective wirings, and provides a short circuit for the secondary winding of the transformer 101 by turning on/off of the transistor Q1 according to the pulse signals outputted from the pulse generating circuit 122. Further, an inductor L1 exemplary shown in FIG. 1 is connected between the collector of the transistor Q1 and one of wirings of the second winding. This inductor L1 is provided for reducing a short circuit current which flows when turning on the switch 103 (transistor Q1), and this inductor L1 may be replaced by a resistor. If the performance of the transistor Q1 and the transformer 101 is not degraded by the short circuit current, it is not necessary to provide the inductor L1 or a resistor. A MOS (Metal Oxide Semiconductor) transistor, a relay or the like can be used for the switching part 113 instead of the transistor Q1.

The short circuit current flows intermittently on the secondary winding of the transformer 101 while the switching part 113 repeats turning on/off by the pulse signals outputted from the pulse generating circuit 122. As a result, pulse-shape electric currents are induced on the primary winding of the transformer 101. The pulse detection circuit 123 detects these pulse-shape electric currents induced on the primary winding of the transformer 101 by using, for example, a well-known current probe, and outputs the detection result to the arithmetic calculation unit 124.

The arithmetic calculation unit 124 includes a well-known pulse counter and a pulse width measurement apparatus or the like in addition to, for example, CPU (Central Processing Unit), a DSP (Digital Signal Processor) or various logic circuits which operates according to software programs. The arithmetic calculation unit 124 measures the pulse attribute (such as frequency, the cycle, the pulse width and the pulse density) of pulse-shape electric currents detected in the pulse detection circuit 123 by using a pulse counter and a pulse width measurement apparatus or the like, and calculates an electric current value which flows through the detection resistor Rs 114 based on the measurement result.

Next, operation of the electric current measurement apparatus according to this exemplary embodiment will be described with reference to drawings.

Figure 5A:
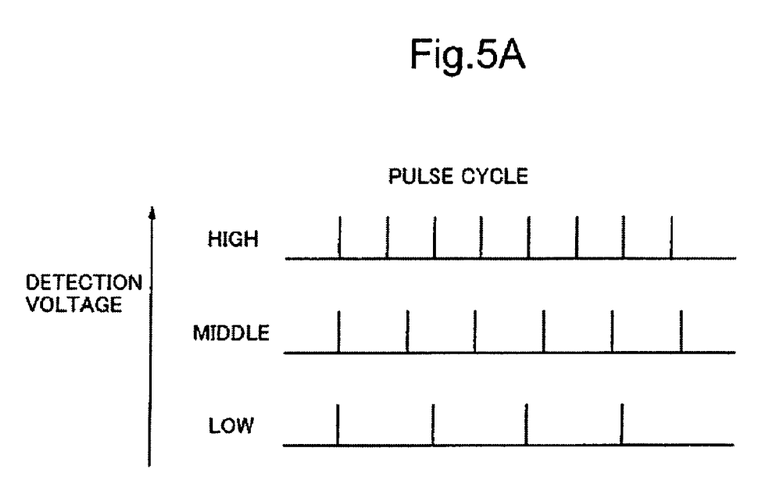
FIG. 5A is a schematic diagram showing an example of each pulse shape outputted by a pulse generating circuit.
Figure 5B:
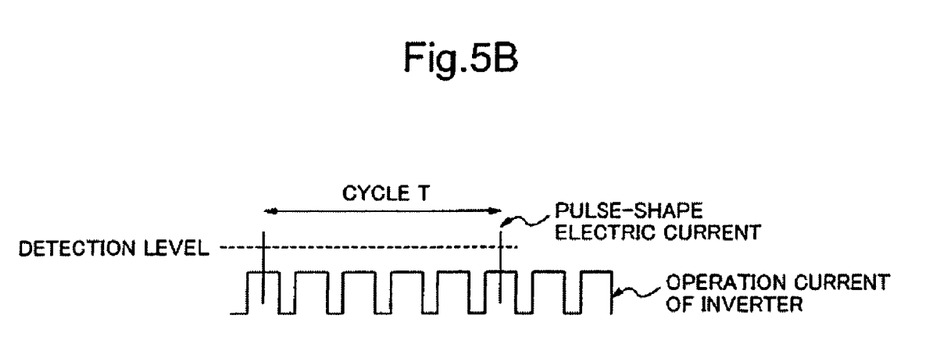
FIG. 5B is a schematic diagram showing an example of a current waveform detected by a pulse detection circuit.

FIG. 5A is a schematic diagram showing an example of pulse shape outputted from the pulse generating circuit 122 shown in FIG. 1. FIG. 5B is a schematic diagram showing an example of current waveform detected in the pulse detection circuit 123.

As mentioned above, the detection circuit 121 outputs the voltage value proportional to an electric current (the cathode current in case of a configuration shown in FIG. 1) flowing through the detection resistor Rs 114. The pulse generating circuit 122 outputs pulse signals having the pulse attribute corresponding to the voltage value received from the detection circuit 121. The pulse attribute changes proportionately to the output voltage value of the detection circuit 121. FIG. 5A shows an example that the higher voltage value outputted from the detection circuit 121 results the higher frequency pulses (a pulse interval is narrow) being outputted from the pulse generating circuit 122. The switching part 113 repeats turning on/off according to these pulses outputted by the pulse generating circuit 122. When the switching part 113 repeats turning on/off, pulse-shape short circuit currents flow on the secondary winding of the transformer 101, and the pulse attribute of the pulse-shape short circuit currents is proportional to the value of the cathode current.

When the pulse-shape short circuit currents intermittently flow on the secondary winding of the transformer 101, pulse-shape electric currents having the same pulse attribute as the short circuit currents on the secondary winding are induced and flow on the primary winding of the transformer 101 (refer to FIG. 5B).

According to this exemplary embodiment, the pulse-shape electric currents flow on the primary winding of the transformer 101 is detected by the pulse detection circuit 123, and the cycle T of the pulse-shape electric currents is measured by the arithmetic calculation unit 124. Here, as shown in FIG. 5B, not only the pulse-shape electric currents but also the pulse signals of operating current of the inverter 102 also flow on the primary winding of the transformer 101. Therefore, the arithmetic calculation unit 124 sets a predetermined detection level in advance, and detects the pulse-shape electric current beyond the detection level as a measuring target electric current corresponding to the short circuit current of the secondary winding of the transformer 101.

The cycle T of the pulse-shape electric currents obtained on the primary winding side of the transformer 101 is equal to the cycle (frequency) of the short circuit currents flowing on the secondary winding of the transformer 101 as mentioned above, and the frequency is proportional to the cathode current value detected by the detection circuit 121.

Accordingly, when a relationship between an electric current which flows through the detection resistor Rs 114 and a pulse signal generated in the pulse generating circuit 122 is known in advance, the cathode current value of the traveling wave tube 1 is obtained by measuring the cycle (frequency) T of the pulse-shape electric currents flowing on the primary winding of the transformer 101. For example, the detected voltage value is obtained from the measured cycle T with referring to the relationship between the voltage value detected by the detection circuit 121 and pulse signal attribute of the pulse signal generated in the pulse generating circuit 122, and the cathode current value is obtained by dividing the detected voltage value by a resistance value of the detection resistor Rs 114.

When arranging the detection resistor Rs 114 in each of desired positions as shown in FIGS. 1-4, the value of the electric current flowing to a desired electrode of the traveling wave tube 1 can be obtained according to the arranged position of the detection resistor Rs 114. That is, the collector current, the helix current and the heater current can also be obtained.

Further, in this exemplary embodiment, an example is shown for the case that the electric current measurement apparatus 110 is incorporated in the heater power supply. This is because the heater voltage is a relatively low voltage (−6.3V, for example), and it can be used as the power supply voltage for the detection circuit 121 and the pulse generating circuit 122 just as it is without changing an operation voltage for these circuits. If the power supply voltage for operating the detection circuit 121 and the pulse generating circuit 122 can be generated, the electric current measurement apparatus 110 of this exemplary embodiment may be included in any of the helix power supply 104 and the collector power supply 105.

According to this exemplary embodiment, the value of electric current which flows to a desired electrode (cathode electrode, helix electrode, collector electrode, heater or anode electrode) of the traveling wave tube 1 is obtained by measuring the pulse attribute of the pulse-shape electric currents flowing on the primary winding of the transformer 101. Therefore, the electric current which flows to any of the desired electrodes of the traveling wave tube 1 safely and simply can be measured without performing necessary treatment for handling high voltage such as an insulation treatment.

Each of the cathode current, the collector current, the helix current, the heater current and the anode current can be measured individually by inserting the detection resistor Rs 114 in series in an appropriate ampere meter route through which an electric current of the measurement target flows. Therefore, the electric current flowing to each electrode of the traveling wave tube 1 can be measured with relatively high accuracy.

A Second Exemplary Embodiment

According to the first exemplary embodiment mentioned above, the configuration for measuring the cathode current, the collector current, the helix current, the heater current and the anode current of the traveling wave tube 1 by detecting electric potential difference at both ends of the detection resistor Rs 114 which occurs by electric currents flowing through detection resistor Rs 114 is shown.

The second exemplary embodiment is proposed about a voltage measurement apparatus for measuring the helix voltage, the collector voltage, the heater voltage and the anode voltage supplied to the traveling wave tube 1.

Figure 6:
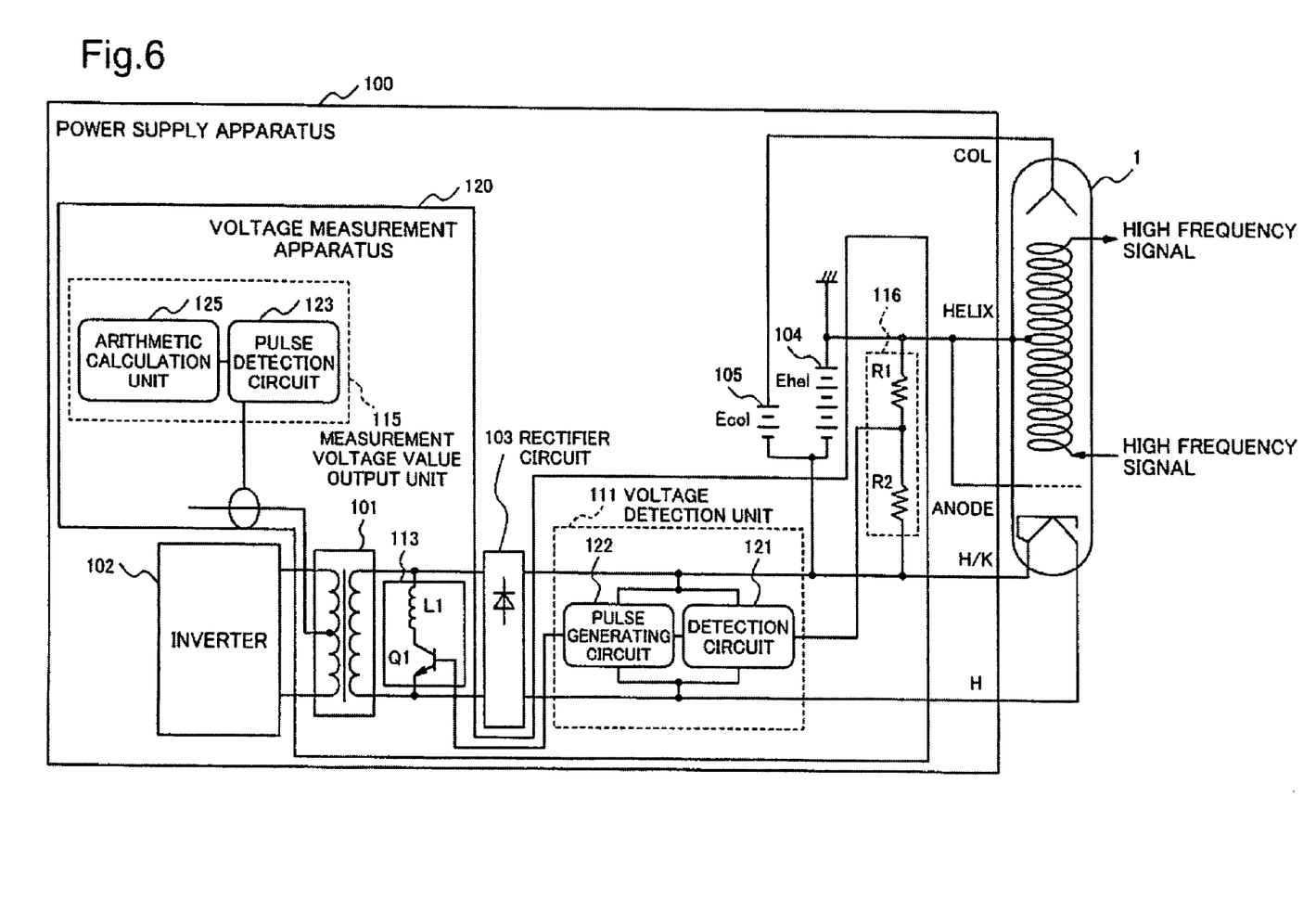
FIG. 6 is a block diagram showing one exemplary configuration of the embodiment of a voltage measurement apparatus for measuring the helix voltage.

FIG. 6 is a block diagram showing one exemplary configuration of the voltage measurement apparatus according to the second exemplary embodiment.

As shown in FIG. 6, instead of the detection resistor Rs 114 shown in FIG. 1, the voltage measurement apparatus 120 of this exemplary embodiment is provided with a voltage dividing resistor 116 which includes resistors R1 and R2.

The voltage measurement apparatus 120 includes a transformer 101 having a primary winding of input side and a secondary winding of output side, and this transformer 101 is shared by the voltage conversion transformer provided in the power supply apparatus 100. The voltage dividing resistor 116 is connected in parallel with target voltage measurement points for dividing a measurement target voltage by using at least two resistors, i.e., resistors R1 and R2 in this case. The voltage detection unit 111 detects a divided voltage of the measurement target voltage and outputs pulse signals. The pulse signals outputted from the voltage detection unit 111 have pulse attribute corresponding to a detected value of the divided voltage. The switching part 113 has the same configuration and the same function as the first exemplary embodiment, and it is connected between two wirings of the secondary winding of the transformer for providing a short circuit of the secondary winding according to the pulse signals outputted from the voltage detection unit. The measured voltage value output unit 115 measures pulse attribute of pulse-shape electric currents. The pulse-shape electric currents are induced on the primary winding of the transformer by the same principle as the first exemplary embodiment. The measured voltage value output unit 115 outputs a value of the measurement target voltage based on the measurement result of the pulse attribute with referring to a predetermined relationship among a voltage dividing ratio of the voltage dividing resistor 116, a voltage value of the divided voltage and the pulse attribute of the pulse signals generated in the voltage detection unit 111.

In more detail, the voltage detection unit 111 includes a detection circuit 121 and a pulse generating circuit 122. The detection circuit 121 detects the divided voltage of the measurement target voltage and outputs the detected voltage value corresponding to the detected value of the divided voltage. The pulse generating circuit 122 generates the pulse signals having pulse attribute which changes proportionally to the detected voltage value outputted from the detection circuit 121. The measured voltage value output unit 115 includes a pulse detection circuit 123 and an arithmetic calculation unit 125. The pulse detection circuit 123 detects the pulse-shape electric currents flowing on the primary winding of the transformer which are induced by intermittent short circuit of the secondary winding provided by the switching part 113. The arithmetic calculation unit 125 measures the pulse attribute of the pulse-shape electric currents detected by the pulse detection circuit 123, and outputs the value of the measurement target voltage based on the measurement result of the pulse attribute with referring to the predetermined relationship among the voltage dividing ratio of the voltage dividing resistor 116, the voltage value of the divided voltage detected by the detection circuit 121 and the pulse attribute of the pulse signals generated in the pulse generating circuit 122.

As a measurement target voltage, the helix voltage, for example, is divided by the resistors R1 and R2 of the voltage dividing resistor 116 which are connected in parallel with target voltage measurement points, i.e., between the helix electrode and the negative electrode of the helix power supply 104. The divided voltage by the voltage dividing resistor 116 is detected by the detection circuit 121. The detection circuit 121 inputs the divided voltage which is divided by the voltage dividing resistor 116, and includes a buffer circuit for outputting the detected voltage with amplified or attenuated.

Figure 7:
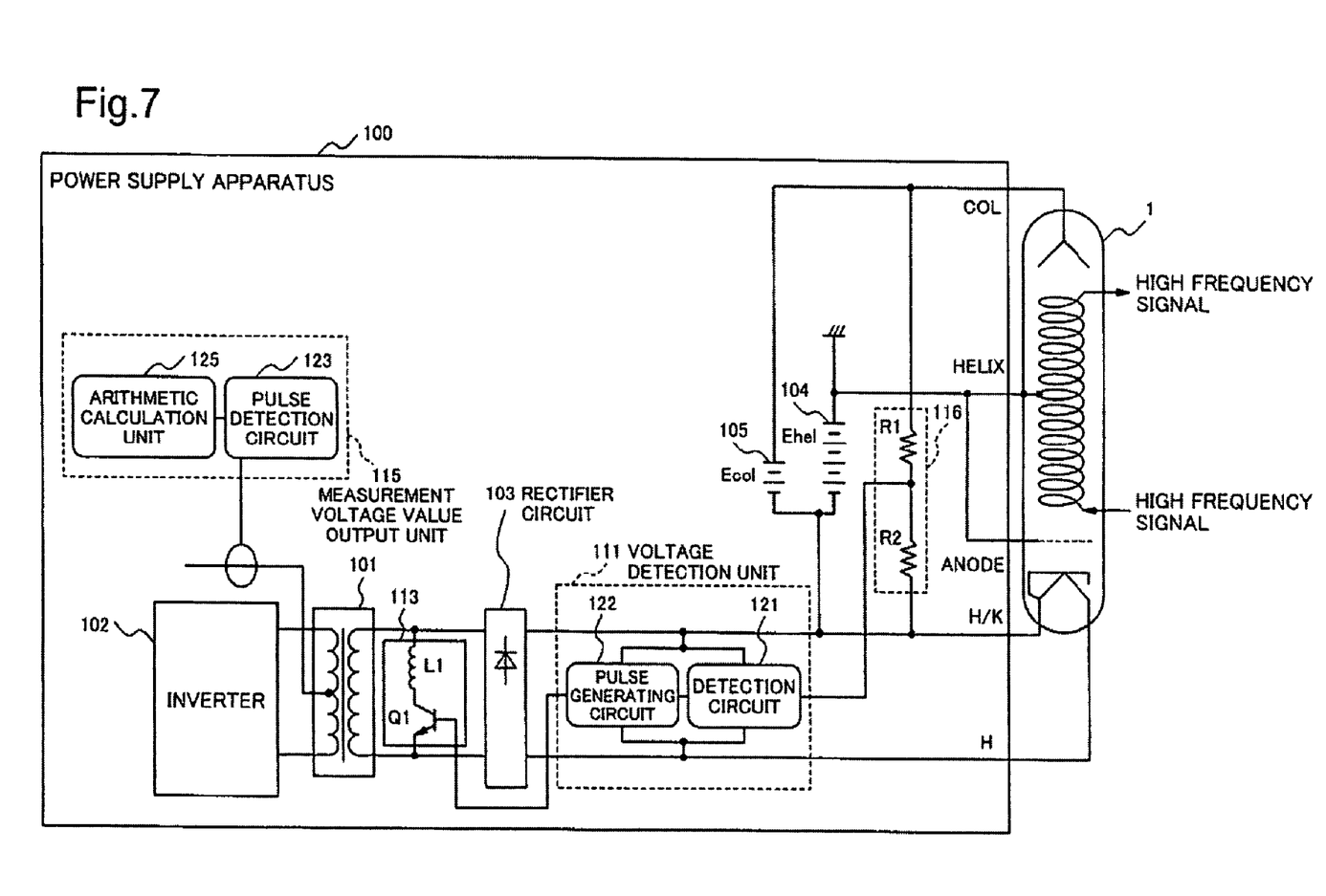
FIG. 7 is a block diagram showing other exemplary configurations of the embodiment of the voltage measurement apparatus for measuring the collector voltage.
Figure 8:
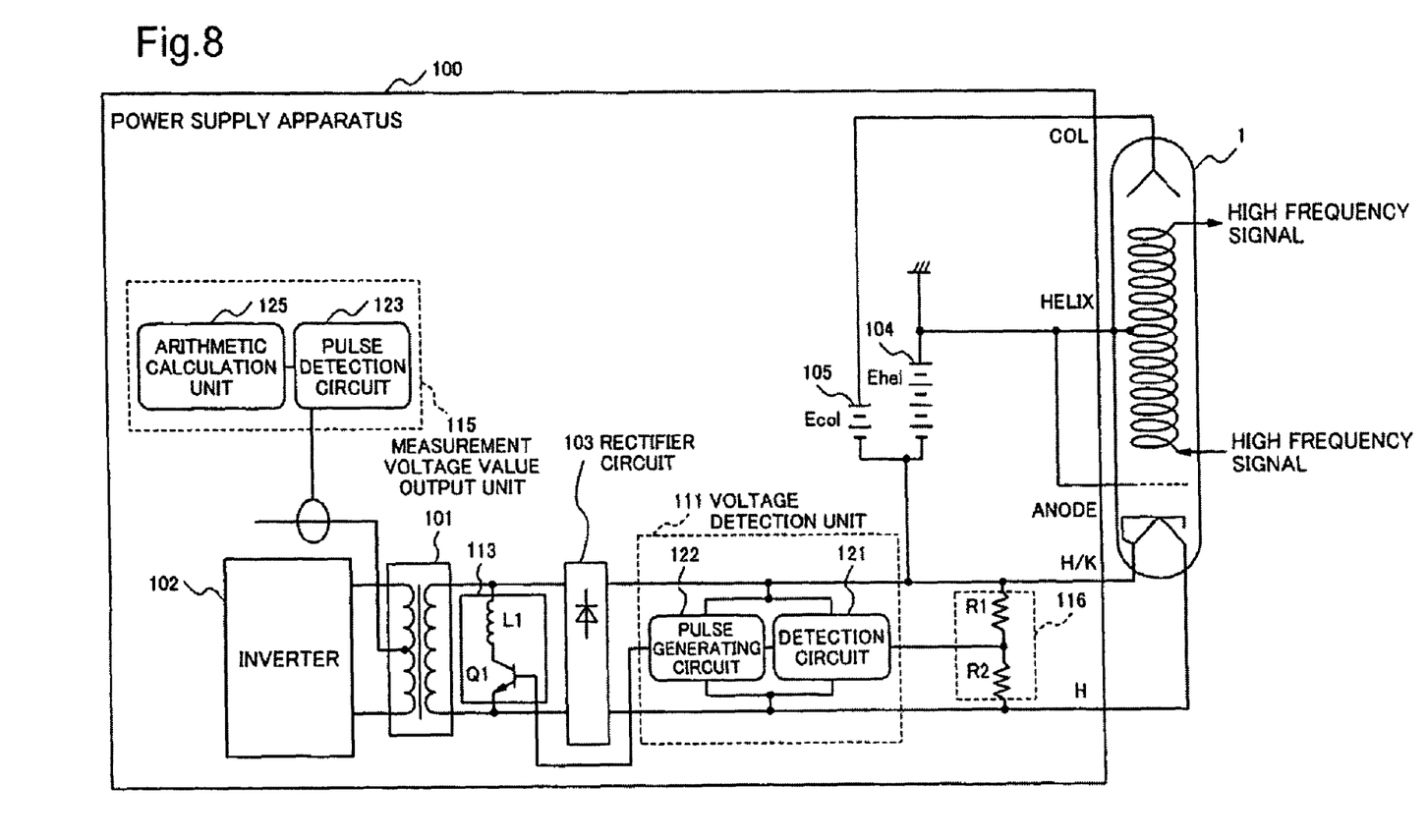
FIG. 8 is a block diagram showing other exemplary configurations of the embodiment of the voltage measurement apparatus for measuring the heater voltage.

When the collector voltage of the traveling wave tube is measured, the voltage dividing resistor 116 including resistors R1 and R2 is inserted, for example, between the cathode electrode and the collector electrode as shown in FIG. 7. When the heater voltage is measured, the voltage dividing resistor 116 including resistors R1 and R2 is inserted between the cathode electrode and the heater as shown in FIG. 8 as the target voltage measurement points. Further, when the anode voltage of the traveling wave tube, in which the anode electrode is not connected to the helix electrode, is measured, the voltage dividing resistor 116 including resistors R1 and R2 is inserted between the cathode electrode and the anode electrode as the target voltage measurement points. It may be equipped with all these voltage dividing resistors 116 including the resistors R1 and R2 in the power supply apparatus 100 for measuring all types of voltage, and also it may be equipped with only one or some of these voltage dividing resistors 116 including the resistors R1 and R2 for measuring one or some types of voltage. When a plurality of voltage dividing resistors 116 including the resistors R1 and R2 are provided for measuring a plurality of types of voltage, for example, the detection circuit 121 and the pulse generating circuit 122 corresponding to respective voltage dividing resistors 116 are also provided and pulse signals outputted from a plurality of pulse generating circuits 112 may be supplied to the switching part 113 successively by using a multiplexer or the like.

The operating principle of the voltage measurement apparatus of this second exemplary embodiment is same as the electric current measurement apparatus of the first exemplary embodiment.

The detection circuit 121 detects the divided voltage between both end points of the resistor R2 of the voltage dividing resistor 116, and outputs a detected voltage value. The pulse generating circuit 122 generates the pulse signals in which the pulse attribute (such as frequency, the cycle, the pulse width and the pulse density) proportionally changes according to the output voltage value of the detection circuit 121. The switching part 113 repeats turning on/off according to the pulse signals outputted from the pulse generating circuit 122. When the switching part 113 repeats turning on/off, the pulse-shape short circuit currents flow on the secondary winding of the transformer 101, and the pulse attribute of the pulse-shape short circuit currents is proportional to the detected voltage value.

When the pulse-shape short circuit currents intermittently flow on the secondary winding of the transformer 101, the pulse-shape electric currents having the same pulse attribute as the short circuit currents on the secondary winding are induced and flow on the primary winding of the transformer 101. The pulse-shape electric currents flow on the primary winding of the transformer 101 are detected by the pulse detection circuit 123, and the cycle T of the pulse-shape electric currents is measured by the arithmetic calculation unit 125.

The cycle T of the pulse-shaped electric currents obtained on the primary winding of the transformer 101 is equal to the cycle (frequency) of the short-circuit currents which flow on the secondary winding of the transformer 101, and the frequency is proportional to the voltage value detected by the detection circuit 121.

Accordingly, when a relationship among a voltage dividing ratio of the voltage dividing resistor 116, a voltage value detected by the detection circuit 121 and a pulse signal generated in the pulse generating circuit 122 is known in advance, the voltage value of the measuring target is obtained by measuring the cycle (frequency) T of the pulse-shape electric currents flowing on the primary winding of the transformer 101. For example, the detected voltage value is obtained from the measured cycle T with referring to the relationship between the voltage value detected by the detection circuit 121 and pulse signal attribute of the pulse signal generated in the pulse generating circuit 122, and the voltage value of the measuring target is obtained by multiplying the detected voltage value and a figure which is determined by the voltage dividing ratio of the voltage dividing resistor 116.

Further, in FIGS. 6-8, an example configuration of the voltage dividing resistor 116 is shown for the case that two resistors R1 and R2 connected in series are used for dividing the voltage supplied between two electrodes of the traveling wave tube 1, however, it does not matter how many resisters are used as far as it can provide the divided voltage of the measuring target voltage to the detection circuit 121.

Because other configuration and operation are the same as that of the first exemplary embodiment, the description will be omitted.

According to this exemplary embodiment, the value of the voltage applied between desired electrodes of the traveling wave tube 1 is obtained by measuring the pulse attribute of the pulse-shape electric currents induced on the primary winding of the transformer 101. Therefore, the applied voltage between the desired electrodes of the traveling wave tube can be measured safely and simply.

The related art described in Japanese Patent No. 2711897 in the background art causes a problem, such that cathode current cannot be measured with high accuracy. Because, in the power supply apparatus according to Japanese Patent No. 2711897, it is supposed that the helix current and the anode current are sufficiently small values compared with the collector current and the cathode current and they are ignored in the measurement, and the cathode current is measured based on the approximation of assuming the cathode current value to be equal to the collector current value.

Also, the related art described in Japanese Patent No. 2711897 causes another problem, such that the helix current and the anode current cannot be measured because they are not considered as measurement targets. In particular, it is desirable to be able to simply measure the helix current because the helix current is the important value to be used for estimating the operating life of the traveling wave tube.

Further, in Japanese Patent No. 2711897, nothing is described about a method to measure the applied voltage to the cathode electrode, the collector electrode, the anode electrode and the heater of the traveling wave tube.

An exemplary advantage according to the invention is that the electric current measurement apparatus and the voltage measurement apparatus which can safely and simply measure an electric current and high voltage applied on each electrode of the electron tube are realized, and also the power supply apparatus including the electric current measurement and the voltage measurement apparatus which supplies high voltage to each electrode of the electron tube is realized.

While this invention has been particularly shown and described with reference to exemplary embodiments thereof, the invention is not limited to those specific embodiments. It will be understood by those of ordinary skill in the art that various changes in form and details may be made therein without departing from the spirit and scope of the present invention as defined by the claims.

Further, it is the inventor's intention to retain all equivalents of the claimed invention even if the claims are amended during prosecution.

What is claimed is:

1. An electric current measurement apparatus for measuring an electric current value flowing to a desired electrode of an electron tube, comprising:
    a transformer having a primary winding of input side and a secondary winding of output side;
    a detection resistor connected in series in an ampere meter route of the desired electrode through which a measurement target electric current flows;
    a voltage detection unit which detects electric potential difference at the detection resistor and outputs pulse signals having pulse attribute corresponding to a detected value of the electric potential difference;
    a switching part connected between two wirings of the secondary winding of the transformer for providing a short circuit of the secondary winding according to the pulse signals outputted from the voltage detection unit; and
    a measurement current value output unit which measures pulse attribute of pulse-shape electric currents being induced on the primary winding of the transformer caused by intermittent short circuit of the secondary winding provided by the switching part, and outputs a value of the measurement target electric current flowing through the detection resistor based on a measurement result of the pulse attribute of the pulse-shape electric currents with referring to a predetermined relationship between a value of the electric current flowing through the detection resistor and the pulse attribute of the pulse signals generated in the voltage detection unit.

2. The electric current measurement apparatus according to claim 1, wherein the voltage detection unit includes,
    a detection circuit which detects the electric potential difference between both ends of the detection resistor and outputs a detected voltage value corresponding to the electric potential difference; and a pulse generating circuit for generating pulse signals having pulse attribute corresponding to the detected voltage value outputted from the detection circuit.

3. The electric current measurement apparatus according to claim 2, wherein the measurement current value output unit includes,
   a pulse detection circuit which detects the pulse-shape electric currents flowing on the primary winding of the transformer which is induced by intermittent short circuit of the secondary winding provided by the switching part; and
   an arithmetic calculation unit which measures the pulse attribute of the pulse-shape electric currents detected by the pulse detection circuit, and outputs a value of the measurement target electric current flowing through the detection resistor based on a measurement result of the pulse attribute of the pulse-shape electric currents with referring to a predetermined relationship between a value of the electric current flowing through the detection resistor and the pulse attribute of the pulse signals generated in the pulse generating circuit.

4. The electric current measurement apparatus according to claim 3, wherein the pulse attribute of the pulse signals generated by the pulse generating circuit is one of a frequency of the pulse signals, a cycle of the pulse signals, a pulse width of each pulse signal and a pulse density of the pulse signals.

5. The electric current measurement apparatus according to claim 4,
   wherein the pulse attribute of the pulse-shape electric currents measured by the arithmetic calculation unit is one of a frequency of the pulse-shape electric currents, a cycle of the pulse-shape electric currents, a pulse width of each pulse-shape electric current and a pulse density of the pulse-shape electric currents, and
   wherein the pulse attribute of the pulse-shape electric currents measured by the arithmetic calculation unit has the same pulse attribute as the pulse attribute of the pulse signals generated by the pulse generating circuit.

6. A voltage measurement apparatus for measuring a voltage vale supplied on a desired electrode of an electro tube, comprising:
   a transformer having a primary winding of input side and a secondary winding of output side;
   a voltage dividing resistor connected in parallel with target voltage measurement points for dividing a measurement target voltage by using at least two resistors;
   a voltage detection unit which detects a divided voltage of the measurement target voltage and outputs pulse signals having pulse attribute corresponding to a detected value of the divided voltage;
   a switching part connected between two wirings of the secondary winding of the transformer for providing a short circuit of the secondary winding according to the pulse signals outputted from the voltage detection unit; and
   a measurement voltage value output unit which measures pulse attribute of pulse-shape electric currents being induced on the primary winding of the transformer caused by intermittent short circuit of the secondary winding provided by the switching part, and outputs a value of the measurement target voltage based on a measurement result of the pulse attribute of the pulse-shape electric currents with referring to a predetermined relationship among a voltage dividing ratio of the voltage dividing resistor, a voltage value of the divided voltage and the pulse attribute of the pulse signals generated in the voltage detection unit.

7. The voltage measurement apparatus according to claim 6, wherein the voltage detection unit includes,
   a detection circuit which detects the divided voltage of the measurement target voltage and outputs a detected voltage value corresponding to the detected value of the divided voltage; and
   a pulse generating circuit for generating pulse signals having pulse attribute corresponding to the detected voltage value outputted from the detection circuit.

8. The voltage measurement apparatus according to claim 7, wherein the measurement voltage value output unit includes,
   a pulse detection circuit which detects the pulse-shape electric currents flowing on the primary winding of the transformer which is induced by intermittent short circuit of the secondary winding provided by the switching part; and
   an arithmetic calculation unit which measures the pulse attribute of the pulse-shape electric currents detected by the pulse detection circuit, and outputs a value of the measurement target voltage based on a measurement result of the pulse attribute of the pulse-shape electric currents with referring to the predetermined relationship among the voltage dividing ratio of the voltage dividing resistor, the voltage value of the divided voltage detected by the detection circuit and the pulse attribute of the pulse signals generated in the pulse generating circuit.

9. The voltage measurement apparatus according to claim 8, wherein the pulse attribute of the pulse signals generated by the pulse generating circuit is one of a frequency of the pulse signals, a cycle of the pulse signals, a pulse width of each pulse signal and a pulse density of the pulse signals.

10. The voltage measurement apparatus according to claim 9,
    wherein the pulse attribute of the pulse-shape electric currents measured by the arithmetic calculation unit is one of a frequency of the pulse-shape electric currents, a cycle of the pulse-shape electric currents, a pulse width of each pulse-shape electric current and a pulse density of the pulse-shape electric currents, and
    wherein the pulse attribute of the pulse-shape electric currents measured by the arithmetic calculation unit has the same pulse attribute as the pulse attribute of the pulse signals generated by the pulse generating circuit.

11. A power supply apparatus for supplying electric power to respective electrodes of an electron tube, comprising:
    a plurality of direct-current voltage supply sources, each of the direct-current voltage supply sources supplies a predetermined value of voltage on respective electrodes of the electron tube; and
    an electric current measurement apparatus for measuring an electric current value flowing to a desired electrode of the electron tube including,
       a detection resistor connected in series in an ampere meter route of a desired electrode through which a measurement target electric current flows;
       a voltage detection unit which detects electric potential difference at the detection resistor and outputs pulse signals having pulse attribute corresponding to a detected value of the electric potential difference;
       a switching part connected between two wirings of a secondary winding of a transformer of one of the direct-current voltage supply sources for providing a short circuit of the secondary winding according to the pulse signals outputted from the voltage detection unit; and a measurement current value output unit which measures pulse attribute of pulse-shape electric currents being induced on a primary winding of the transformer caused by intermittent short circuit of the secondary winding provided by the switching part, and outputs a value of the measurement target electric current flowing through the detection resistor based on a measurement result of the pulse attribute of the pulse-shape electric currents with referring to a predetermined relationship between a value of the electric current flowing through the detection resistor and the pulse attribute of the pulse signals generated in the voltage detection unit, wherein operating power of the voltage detection unit is supplied by one of the direct-current voltage supply sources.

12. The power supply apparatus according to claim 11, further comprising;

a voltage measurement apparatus for measuring a voltage vale supplied on a desired electrode of the electro tube, including, a voltage dividing resistor connected in parallel with target voltage measurement points for dividing a measurement target voltage by using at least two resistors;

a voltage detection unit which detects a divided voltage of the measurement target voltage and outputs pulse signals having pulse attribute corresponding to a detected value of the divided voltage;

a switching part connected between two wirings of a secondary winding of a transformer of one of the direct-current voltage supply sources for providing a short circuit of the secondary winding according to the pulse signals outputted from the voltage detection unit; and a measurement voltage value output unit which measures pulse attribute of pulse-shape electric currents being induced on a primary winding of the transformer caused by intermittent short circuit of the secondary winding provided by the switching part, and outputs a value of the measurement target voltage based on a measurement result of the pulse attribute of the pulse-shape electric currents with referring to a predetermined relationship among a voltage dividing ratio of the voltage dividing resistor, a voltage value of the divided voltage and the pulse attribute of the pulse signals generated in the voltage detection unit, wherein operating power of the voltage detection unit is supplied by one of the direct-current voltage supply sources.

13. A method of an electric current measurement for measuring an electric current value flowing to a desired electrode of an electron tube, comprising:

providing a transformer having a primary winding of input side and a secondary winding of output side;

providing a detection resistor connected in series in an ampere meter route of the desired electrode through which a measurement target electric current flows;

detecting electric potential difference between both ends of the detection resistor and outputting pulse signals having pulse attribute corresponding to a detected value of the electric potential difference;

providing a short circuit of the secondary winding of the transformer for intermittently connecting the short circuit according to the outputted pulse signals;

measuring pulse attribute of pulse-shape electric currents being induced on the primary winding of the transformer caused by intermittent connection of the short circuit of the secondary winding; and outputting a value of the measurement target electric current flowing through the detection resistor based on a measurement result of the pulse attribute of the pulse-shape electric currents by a calculation with referring to a predetermined relationship between a value of the electric current flowing through the detection resistor and the pulse attribute of the outputted pulse signals.

14. A method of a voltage measurement for measuring a voltage vale supplied on a desired electrode of an electro tube, comprising:

providing a transformer having a primary winding of input side and a secondary winding of output side;

providing a voltage dividing resistor connected in parallel with target voltage measurement points for dividing a measurement target voltage by using at least two resistors;

detecting a divided voltage of the measurement target voltage and outputting pulse signals having pulse attribute corresponding to a detected value of the divided voltage;

providing a short circuit of the secondary winding of the transformer for intermittently connecting the short circuit according to the outputted pulse signals;

measuring pulse attribute of pulse-shape electric currents being induced on the primary winding of the transformer caused by intermittent connection of the short circuit of the secondary winding; and outputting a value of the measurement target voltage based on a measurement result of the pulse attribute of the pulse-shape electric currents by a calculation with referring to a predetermined relationship among a voltage dividing ratio of the voltage dividing resistor, a voltage value of the divided voltage and the pulse attribute of the outputted pulse signals.

* * * * *

UNITED STATES PATENT AND TRADEMARK OFFICE
CERTIFICATE OF CORRECTION

PATENT NO.        : 8,027,182 B2
APPLICATION NO.   : 12/403105
DATED             : September 27, 2011
INVENTOR(S)       : Shuji Abiko It is certified that error appears in the above-identified patent and that said Letters Patent is hereby corrected as shown below:

Title page, left column, delete the following,

"(73) Assignee: NEC Microwave Tube, Ltd., Kanagawa (JP)"

and insert the following.

--(73) Assignee: NETCOMSEC CO. LTD, Tokyo (JP)--

Signed and Sealed this
Twenty-fourth Day of December, 2013

Margaret A. Focarino
*Commissioner for Patents of the United States Patent and Trademark Office*